United States Patent
Xu et al.

(10) Patent No.: US 12,328,104 B2
(45) Date of Patent: Jun. 10, 2025

(54) POWER AMPLIFIER

(71) Applicant: University of Electronic Science and Technology of China, Chengdu (CN)

(72) Inventors: Yuehang Xu, Chengdu (CN); Bowen Tang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 533 days.

(21) Appl. No.: 17/875,465

(22) Filed: Jul. 28, 2022

(65) Prior Publication Data

US 2023/0327611 A1 Oct. 12, 2023

(30) Foreign Application Priority Data

Apr. 7, 2022 (CN) .......................... 202210362457.1

(51) Int. Cl.
*H03F 1/42* (2006.01)
*H03F 1/32* (2006.01)
*H03F 3/24* (2006.01)

(52) U.S. Cl.
CPC ................. *H03F 1/42* (2013.01); *H03F 1/32* (2013.01); *H03F 3/245* (2013.01); *H03F 2200/36* (2013.01); *H03F 2200/451* (2013.01)

(58) Field of Classification Search
CPC ... H03F 1/42; H03F 1/32; H03F 3/245; H03F 2200/36; H03F 2200/451; H03F 2200/12; H03F 2200/21; H03F 2200/216; H03F 2200/24; H03F 2200/297; H03F 2200/301; H03F 2200/42; H03F 2200/48; H03F 1/18; H03F 1/3205; H03F 3/211; H03F 3/195; Y02D 30/70
USPC .................................................. 330/310, 286
See application file for complete search history.

(56) References Cited

U.S. PATENT DOCUMENTS

| | | | |
|---|---|---|---|
| 6,556,080 B1 * | 4/2003 | Stengel ................. | H03F 1/3223 330/306 |
| 11,646,801 B1 * | 5/2023 | Bi ........................ | H04B 10/612 398/202 |

* cited by examiner

*Primary Examiner* — Hieu P Nguyen
(74) *Attorney, Agent, or Firm* — MATTHIAS SCHOLL P.C.; Matthias Scholl

(57) ABSTRACT

An ultra-wideband power amplifier includes a preamplifier circuit and a post amplifier circuit. The preamplifier circuit includes a first DC blocking capacitor $C_1$, a first decoupling capacitor $C_2$, a second decoupling capacitor $C_3$, a stabilizing resistor $R_{in}$, a first AC blocking resistor $RG_1$, a first input inductor $L_1$, a second input inductor $L_2$, an output inductor $L_3$, a first input microstrip line $MLIN_1$, a second input microstrip line $MLIN_2$, an output microstrip line $MLIN_3$, and a first transistor $Q_1$. A first end of the first DC blocking capacitor $C_1$ acts as an input terminal of the preamplifier circuit, and a second end of the first DC blocking capacitor $C_1$ is connected to the stabilizing resistor $R_{in}$, the first input inductor $L_1$, the first input microstrip line $MLIN_1$, and a gate electrode of the first transistor $Q_1$ sequentially. One end of the first decoupling capacitor $C_2$ is grounded.

1 Claim, 5 Drawing Sheets

POWER AMPLIFIER

CROSS-REFERENCE TO RELATED APPLICATIONS

Pursuant to 35 U.S.C. § 119 and the Paris Convention Treaty, this application claims foreign priority to Chinese Patent Application No. 202210362457.1 filed Apr. 7, 2022, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, MA 02142.

BACKGROUND

The disclosure relates to the field of microwave integrated circuits, and more particularly, to an ultra-wideband power amplifier.

A power amplifier (PA) is a final stage core device of a transmission chain and is crucial to the operating distance of a wireless system. An ultra-wideband and high-linearity power amplifier is widely used in an integrated electronic system because of its comprehensive functions in radar, electronic countermeasures, communication data chain, etc.

Linearization techniques, such as load modulation and pre-distortion, increase the complexity of a power amplifier, and pose an adverse effect on the amplification effect. Narrow-band linearization techniques, such as Doherty, harmonic termination and harmonic injection, are unsuitable for use in an ultra-wideband power amplifier with multiple octave bands. Although a power backoff method increases the linearity, the amplification efficiency of the ultra-wideband power amplifier decreases. Thus, the ultra-wideband amplifiers are difficult to achieve both high efficiency and high linearity.

SUMMARY

To solve the aforesaid problems, the disclosure provides an ultra-wideband power amplifier having both high amplification efficiency and high linearity under low power backoff.

An ultra-wideband power amplifier comprises a preamplifier circuit and a post amplifier circuit; the preamplifier circuit comprises a first DC blocking capacitor $C_1$, a first decoupling capacitor $C_2$, a second decoupling capacitor $C_3$, a stabilizing resistor $R_{in}$, a first AC blocking resistor $RG_1$, a first input inductor $L_1$, a second input inductor $L_2$, an output inductor $L_3$, a first input microstrip line $MLIN_1$, a second input microstrip line $MLIN_2$, an output microstrip line $MLIN_3$, and a first transistor $Q_1$; a first end of the first DC blocking capacitor $C_1$ acts as an input terminal of the preamplifier circuit, and a second end of the first DC blocking capacitor $C_1$ is connected to the stabilizing resistor $R_{in}$, the first input inductor $L_1$, the first input microstrip line $MLIN_1$, and a gate electrode of the first transistor $Q_1$ sequentially; a first end of the first decoupling capacitor $C_2$ is grounded, and a second end of the first decoupling capacitor $C_2$ is connected to the first AC blocking resistor $RG_1$, the second input inductor $L_2$, the second input microstrip line $MLIN_2$, and the gate electrode of the first transistor $Q_1$ sequentially; a junction of the first decoupling capacitor $C_2$ and the first AC blocking resistor $RG_1$ is connected to a gate supply voltage $V_{gs1}$; a first end of the second decoupling capacitor $C_3$ is grounded, and a second end of the second decoupling capacitor $C_3$ is connected to the output inductor $L_3$, the output microstrip line $MLIN_3$, and a drain electrode of the first transistor $Q_1$ sequentially; a junction of the second decoupling capacitor $C_3$ and the output inductor $L_3$ is connected to a drain supply voltage $V_{ds1}$; and a junction of the output inductor $L_3$ and the output microstrip line $MLIN_3$ acts as an output terminal of the preamplifier circuit;

A second DC blocking capacitor $C_4$ is disposed between the preamplifier circuit and the post amplifier circuit.

The post amplifier circuit comprising a first gate microstrip line $MLIN_4$, a second gate microstrip line $MLIN_5$, a third gate microstrip line $MLIN_6$, a fourth gate microstrip line $MLIN_7$, a drain inductor $L_4$, a first drain microstrip line $MLIN_8$, a second drain microstrip line $MLIN_9$, a second AC blocking resistor $RG_2$, a third decoupling capacitor $C_5$, a fourth decoupling capacitor $C_6$, a third DC blocking capacitor $C_7$, an AC blocking inductor $L_5$, a second transistor $Q_2$, a third transistor $Q_3$, and a fourth transistor $Q_4$; a first end of the gate microstrip line $MLIN_4$ acts as an input terminal of the post amplifier circuit, and a second end of the gate microstrip line $MLIN_4$ is connected to the second gate microstrip line $MLIN_5$, the third gate microstrip line $MLIN_6$, the fourth gate microstrip line $MLIN_7$, the second AC blocking resistor $RG_2$, and the third decoupling capacitor $C_5$ sequentially; and one end of the third decoupling capacitor $C_5$ is grounded; a junction of the second AC blocking resistor $RG_2$ and the third decoupling capacitor $C_5$ is connected to a gate supply voltage $V_{gs2}$; a junction of first gate microstrip line $MLIN_4$ and the second gate microstrip line $MLIN_5$ is connected to a gate electrode of the second transistor $Q_2$; a junction of the second gate microstrip line $MLIN_5$ and the third gate microstrip line $MLIN_6$ is connected to a gate electrode of the third transistor $Q_3$; a junction of the third gate microstrip line $MLIN_6$ and the fourth gate microstrip line $MLIN_7$ is connected to a gate electrode of the fourth transistor $Q_4$; the drain inductor $L_4$ is disposed between drain electrodes of the second transistor $Q_2$ and the third transistor $Q_3$; the first drain microstrip line $MLIN_8$ is disposed between drain electrodes of the third transistor $Q_3$ and the fourth transistor $Q_4$; a junction of the first drain microstrip line $MLIN_8$ and the fourth transistor $Q_4$ is connected to a first end of the second drain microstrip line $MLIN_9$; a second end of the second drain microstrip line $MLIN_9$ is connected to first ends of the fourth decoupling capacitor $C_6$, the AC blocking inductor $L_5$, and the third DC blocking capacitor $C_7$; a second end of the fourth decoupling capacitor $C_6$ is grounded; a second end of the AC blocking inductor $L_5$ is connected to a voltage source $V_{ds2}$; and a second end of the third DC blocking capacitor $C_7$ acts as an output terminal of the post amplifier circuit.

The ultra-wideband power amplifier comprises a preamplifier circuit and a post amplifier circuit. The ultra-wideband pre-amplifier circuit amplifies the input signal and can adjust the gate voltage. The circuit further amplifies the output signal of the previous stage. By matching a single transistor with a traveling wave structure, and then matching it with a multi-stage traveling wave structure, high linearity can be achieved and high efficiency can be maintained under low output power back-off, which solves the problems of linearity and efficiency of ultra-wideband power amplifiers.

DETAILED DESCRIPTION OF THE DRAWINGS

DETAILED DESCRIPTION OF THE EMBODIMENTS

To further illustrate, embodiments detailing an ultra-wideband power amplifier are described below. It should be noted that the following embodiments are intended to describe and not to limit the disclosure.

Example 1

An ultra-wideband power amplifier comprises a power supply, a preamplifier circuit, a second DC blocking capacitor $C_4$, and a post amplifier circuit; the preamplifier circuit comprises a first DC blocking capacitor $C_1$, a first decoupling capacitor $C_2$, a second decoupling capacitor $C_3$, a stabilizing resistor $R_{in}$, a first AC blocking resistor $RG_1$, a first input inductor $L_1$, a second input inductor $L_2$, an output inductor $L_3$, a first input microstrip line $MLIN_1$, a second input microstrip line $MLIN_2$, an output microstrip line $MLIN_3$, and a first transistor $Q_1$; the post amplifier circuit comprises a first gate microstrip line $MLIN_4$ and a multi-stage traveling-wave amplifier circuit; the multi-stage traveling-wave amplifier circuit comprises a second gate microstrip line $MLIN_5$, a third gate microstrip line $MLIN_6$, a fourth gate microstrip line $MLIN_7$, a drain inductor $L_4$, a first drain microstrip line $MLIN_8$, a second drain microstrip line $MLIN_9$, a second AC blocking resistor $RG_2$, a third decoupling capacitor $C_5$, a fourth decoupling capacitor $C_6$, a third DC blocking capacitor $C_7$, an AC blocking inductor $L_5$, a second transistor $Q_2$, a third transistor $Q_3$, and a fourth transistor $Q_4$; the first DC blocking capacitor $C_1$, the first decoupling capacitor $C_2$, the stabilizing resistor $R_{in}$, the second AC blocking resistor $RG_2$, the first input microstrip line $MLIN_1$, and the second input microstrip line $MLIN_2$ are used to match a first impedance at an input terminal of the first transistor $Q_1$; the output microstrip line $MLIN_3$ is used to match a second impedance at an output terminal of the first transistor $Q_1$; and the preamplifier circuit is connected to the second DC blocking capacitor $C_4$, the first gate microstrip line $MLIN_4$, and the multi-stage traveling-wave amplifier circuit sequentially.

Simulation results of the ultra-wideband power amplifier show that a working frequency is 0.03-2.5 GHz, an output frequency is greater than 41 dBm, a power-added efficiency (PAE) is greater than 47%, a gain is greater than 15 dB; and the ultra-wideband power amplifier further comprises a signal source $Z_s$ and a load $Z_L$.

Figure 1:
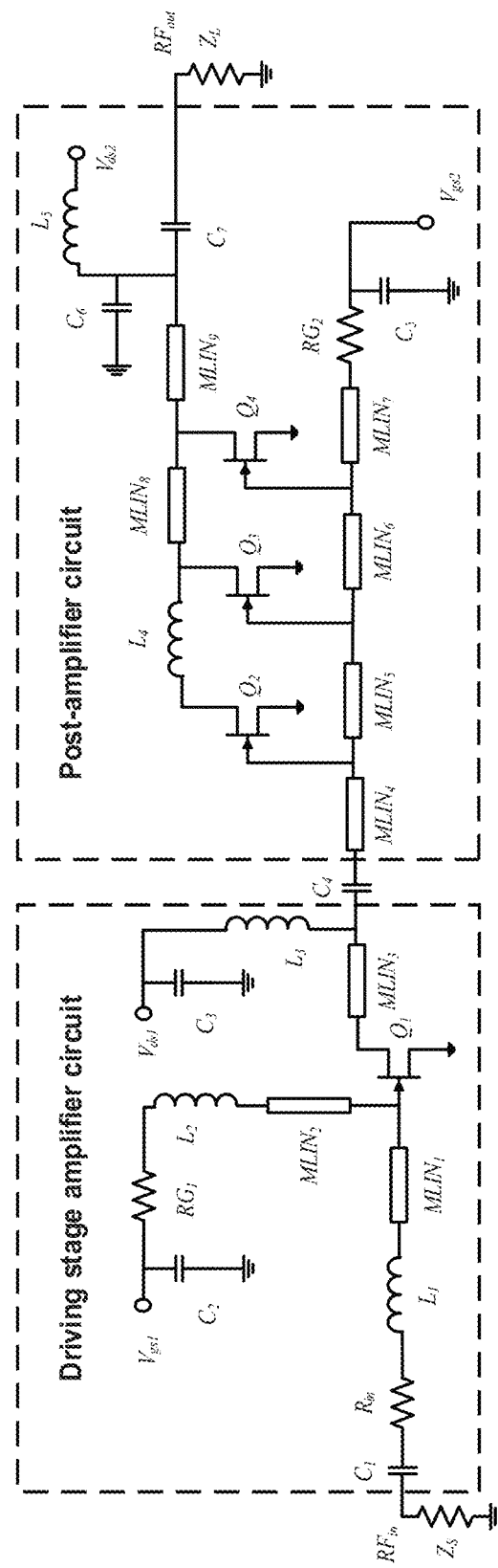
FIG. 1 is a schematic diagram of an ultra-wideband power amplifier according to Example 1 of the disclosure.

FIG. 1 is a schematic diagram of the ultra-band power amplifier of the disclosure. A radio frequency (RF) signal is transmitted to the preamplifier circuit for amplification; and the size of the first transistor $Q_1$ is small for better impedance matching and ultra-wideband amplification with flat gain.

The RF signal is transmitted from the preamplifier circuit to the post amplifier circuit via the second DC blocking capacitor $C_4$; the post amplifier circuit comprises a distributed amplifier topology; the first gate microstrip line $MLIN_4$ acts as an input terminal of the post amplifier circuit and adjusts an output impedance of the first transistor $Q_1$; the sizes of the second transistor $Q_2$, the third transistor $Q_3$, and the fourth transistor $Q_4$ are different for achieving an optimal power and an improved efficiency of impedance matching; and the drain inductor $L_4$ has a high inductance for better impendence matching.

Inductance and resistance are used to match an impedance at an input terminal of the preamplifier circuit so that an excellent standing wave is formed; and the preamplifier circuit is used in conjunction with the post amplifier to form a desired reverse isolation.

The first DC blocking capacitor $C_1$, second DC blocking capacitor $C_4$, and the third DC blocking capacitor $C_7$ are high-capacity off-chip capacitors for blocking a low-frequency DC signal; and the output inductor $L_3$ and AC blocking inductor $L_5$ are high-capacity off-chip inductors for preventing a loss of a low-frequency signal.

Multiple nonlinear components in the transistor are superpositioned, resulting in a sweet spot in a $3^{rd}$ order intermodulation distortion at a critical input power. Specifically, as the input power varies, the level of the $3^{rd}$ order intermodulation distortion is lowered to a minimum value, at which the corresponding input power is defined as the sweet spot. The preamplifier circuit is configured to send the output signal to the post amplifier circuit. The signal source is configured to generate a fundamental signal and transmit it to the preamplifier circuit. The preamplifier circuit outputs a plurality of signals that comprises a plurality of frequency components caused by a nonlinear effect; fundamental frequency components are nonlinear and generates $5^{th}$ and higher order frequency components; $3^{rd}$ order frequency components in the preamplifier circuit are produced by nonlinearity of the fundamental frequency components and by the $5^{th}$ and higher order frequency components; the plurality of frequency components, which have different amplitudes and phases, are transmitted to the post amplifier circuit; a plurality of more complex frequency components are produced due to a non-linear superposition of the plurality of frequency components; $3^{rd}$ order frequency components in the post amplifier circuit comprises the $3^{rd}$ order frequency components which are transmitted from the preamplifier circuit, amplified from the $3^{rd}$ order frequency components in the preamplifier circuit, and generated by $1^{st}$, $2^{nd}$, $5^{rd}$ and higher other order frequency components.

A gate supply voltage across the preamplifier circuit is adjusted to produce a plurality of non-linear frequency components having different amplitudes and phases; the plurality of non-linear frequency components is transmitted to the post amplifier circuit and results in different non-linear effects; the non-linear effects include the fact that the value for the sweet spot varies with the gate supply voltage across the preamplifier circuit; that is, the gate supply voltage is adjusted to produce different sweet spots; at each of the different sweet spots, the level of the $3^{rd}$ order intermodulation distortion is lowered to a minimum value, and a $3^{rd}$ order output intercept point (OIP3) has a maximum value; so the gate supply voltage is adjusted to make the plurality of sweet spot has a value close to a saturation output power, thus achieving a high-linearity and high-efficiency amplifier at a low back-off output power level. The power back-off method is also suitable for harmonic tuning.

The preamplifier circuit comprises a stabilizing resistor $R_{in}$, a first AC blocking resistor $RG_1$, a first input inductor $L_1$, a second input inductor $L_2$, a first input microstrip line $MLIN_1$, a second input microstrip line $MLIN_2$, an output microstrip line MLIN$_3$, a first DC blocking capacitor C$_1$, a first decoupling capacitor C$_2$, a second decoupling capacitor C$_3$, a gate supply voltage V$_{gs1}$, a drain supply voltage V$_{ds1}$, and a first transistor Q$_1$; a first end of the first DC blocking capacitor C$_1$ is connected to the stabilizing resistor R$_{in}$; and a second end of the first DC blocking capacitor C$_1$ is connected to the signal source Z$_s$.

The power amplifier further comprises a second DC blocking capacitor C$_4$ disposed between the preamplifier circuit and the post amplifier circuit.

The post amplifier circuit comprises a first gate microstrip line MLIN$_4$, a second gate microstrip line MLIN$_5$, a third gate microstrip line MLIN$_6$, a fourth gate microstrip line MLIN$_7$, a drain inductor L$_4$, a first drain microstrip line MLIN$_8$, a second drain microstrip line MLIN$_9$, a second AC blocking resistor RG$_2$, a third decoupling capacitor C$_5$, and a fourth decoupling capacitor C$_6$, a third DC blocking capacitor C$_7$, an AC blocking inductor L$_5$, a second transistor Q$_2$, a third transistor Q$_3$, a fourth transistor Q$_4$, a gate supply voltage V$_{gs2}$, and a drain supply voltage Vasa, a first end of the third DC blocking capacitor C$_7$ is connected to the second drain microstrip line MLIN$_9$; and a second end of the third DC blocking capacitor C$_7$ is connected to the load Z$_L$.

The transistor comprises a source electrode that is grounded.

Comparison Example 1

Figure 2:
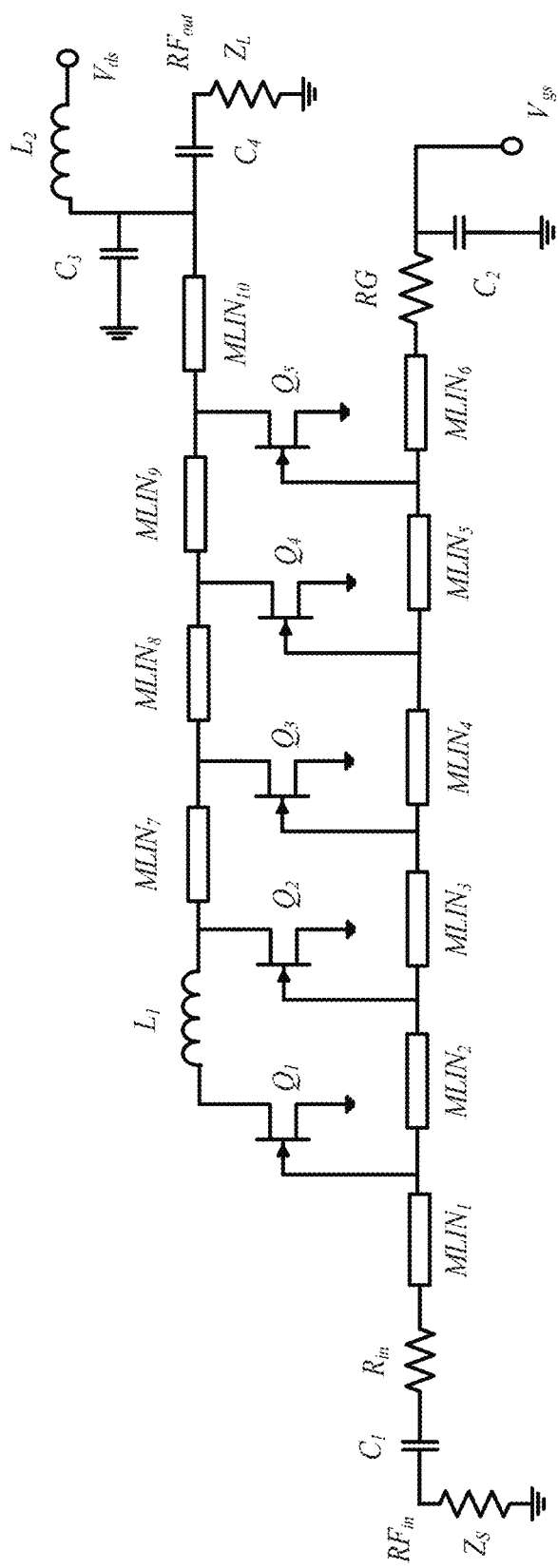
FIG. 2 is a schematic diagram of an ultra-wideband power amplifier according to Comparison example 1 of the disclosure.
Figure 3:
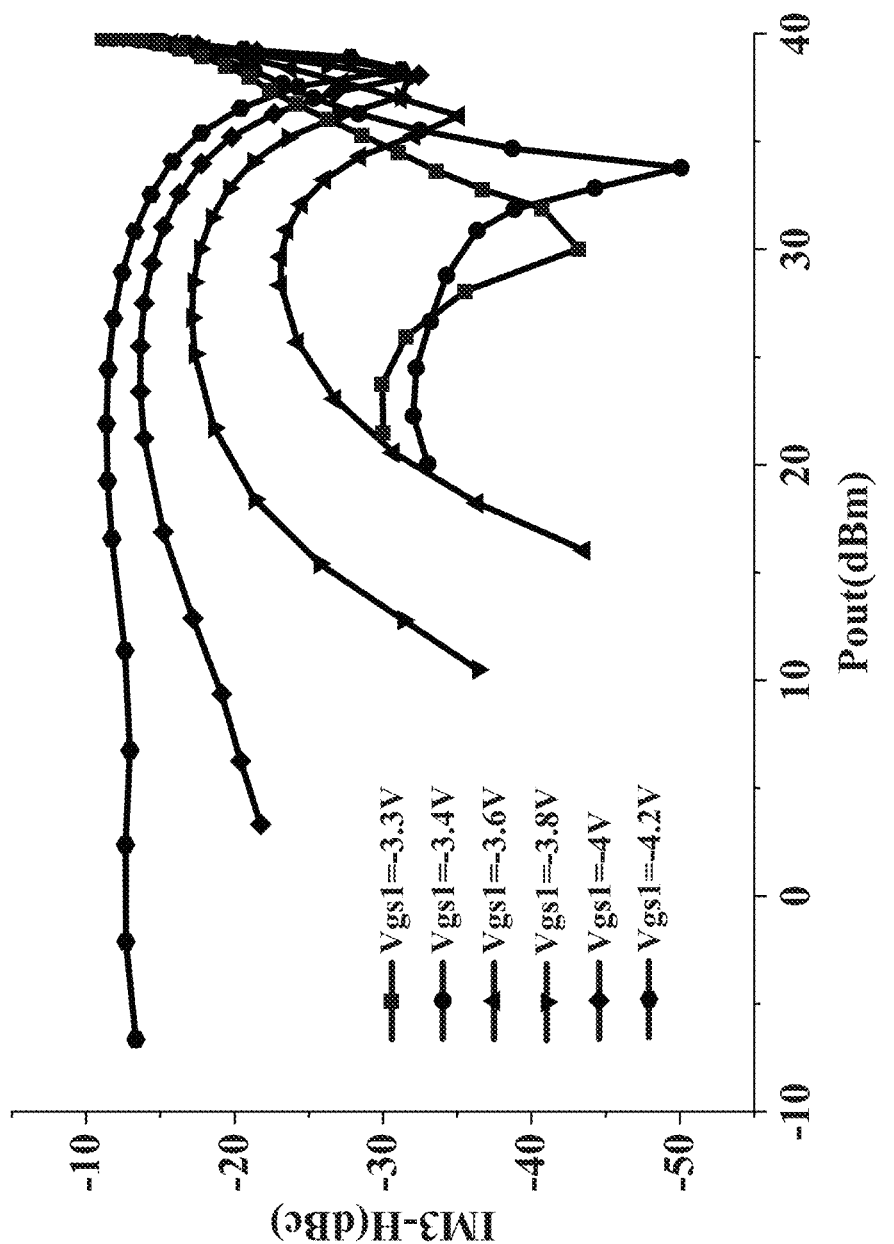
FIG. 3 is a graph of a simulation result obtained in accordance with Example 1 of the disclosure.

A second example of the ultra-wideband power amplifier is illustrated in FIG. 2. It is similar to the example described in Example 1, except for the following difference: the ultra-wideband power amplifier comprises a distributed amplifier topology instead of the preamplifier circuit. Simulation results of the ultra-wideband power amplifier in FIG. 2 show that a working frequency is 0.03-2.5 GHz, an output power is greater than 40 dBm, a gain is greater than 10 dB, and a power-added efficiency is greater than 48%.

FIG. 1 is a graph illustrating a simulation result of a position of a sweet spot in a 3$^{rd}$ order intermodulation distortion at 12.00 MHz (with a frequency interval of 1 MHz) according to Example 3 of the disclosure.

Figure 4:
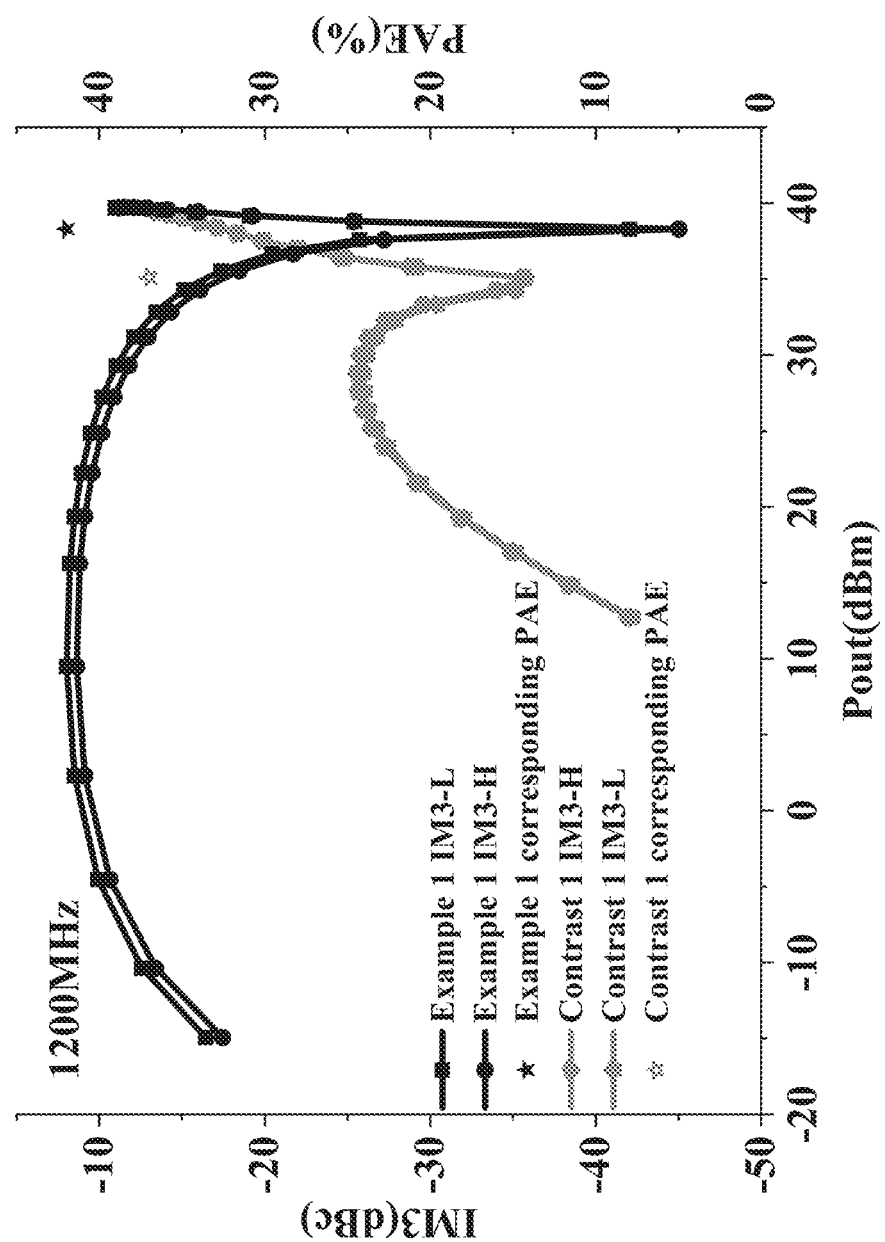
FIG. 4 is a comparison graph of simulation results obtained in accordance with Example 1 and Comparison example 1 of the disclosure.
Figure 5:
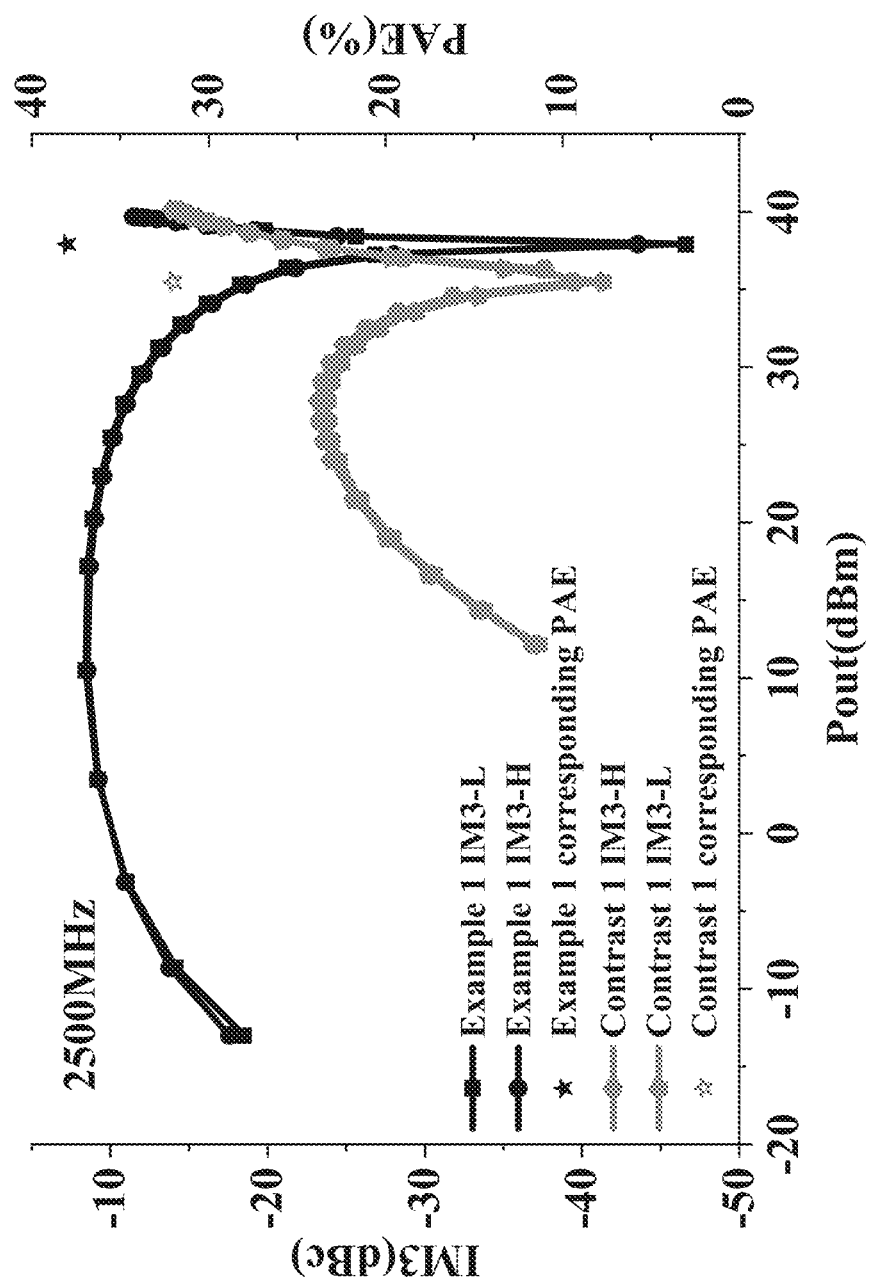
FIG. 5 is a comparison graph of simulation results obtained in accordance with Example 1 and Comparison example 1 of the disclosure.

FIGS. 4-5 are comparison graphs of simulation results obtained in accordance with Example 1 and Comparison example 1.

FIG. 4 is a comparison graph of IM3 and corresponding PAE at a minimum value of IM3 at 1200 MHz (with a frequency interval of 1 MHz) according to Example 1 and Comparison example 1. In Example 1, the output power back-off 1.4 dB, resulting in IM3 of −45 dBc and the corresponding PAE of 41%; and in Comparison example 1, the output power back-off 5 dB, resulting in IM3 of −35 dBc and the corresponding PAE of 38.3%.

FIG. 5 is a comparison graph of IM3 and corresponding PAE at a maximum value of IM3 at 2500 MHz (with a frequency interval of 1 MHz) according to Example 1 and Comparison example 1. In Example 1, the output power back-off 1.6 dB, resulting in IM3 of −46 dBc and the corresponding PAE of 38.5%; in Comparison example 1, the output power back-off 5 dB, resulting in IM3 of −41 dBc and the corresponding PAE of 31.6%.

In the disclosure, the pre-amplifier circuit comprises a single transistor matched amplifier and is matched with the multi-stage traveling wave amplifier of the post-stage; and the transistors are properly biased to improve linearity and efficiency of an ultra-wideband power amplifier.

It will be obvious to those skilled in the art that changes and modifications may be made, and therefore, the aim in the appended claims is to cover all such changes and modifications.

What is claimed is:

1. A power amplifier, comprising:
   1) a preamplifier circuit, the preamplifier circuit comprising a first DC blocking capacitor C$_1$, a first decoupling capacitor C$_2$, a second decoupling capacitor C$_3$, a stabilizing resistor Rill, a first AC blocking resistor RG$_1$, a first input inductor L$_1$, a second input inductor L$_2$, an output inductor L$_3$, a first input microstrip line MLIN$_1$, a second input microstrip line MLIN$_2$, an output microstrip line MLIN$_3$, and a first transistor Q$_1$; and
   2) a post amplifier circuit, the post amplifier circuit comprising a first gate microstrip line MLIN$_4$, a second gate microstrip line MLIN$_5$, a third gate microstrip line MLIN$_6$, a fourth gate microstrip line MLIN$_7$, a drain inductor L$_4$, a first drain microstrip line MLIN$_8$, a second drain microstrip line MLIN$_9$, a second AC blocking resistor RG$_2$, a third decoupling capacitor C$_5$, a fourth decoupling capacitor C$_6$, a third DC blocking capacitor C$_7$, an AC blocking inductor L$_5$, a second transistor Q$_2$, a third transistor Q$_3$, and a fourth transistor Q$_4$;

wherein:
a first end of the first DC blocking capacitor C$_1$ acts as an input terminal of the preamplifier circuit, and a second end of the first DC blocking capacitor C$_1$ is connected to the stabilizing resistor R$_{in}$, the first input inductor L$_1$, the first input microstrip line MLIN$_1$, and a gate electrode of the first transistor Q$_1$ sequentially;

a first end of the first decoupling capacitor C$_2$ is grounded, and a second end of the first decoupling capacitor C$_2$ is connected to the first AC blocking resistor RG$_1$, the second input inductor L$_2$, the second input microstrip line MLIN$_2$, and the gate electrode of the first transistor Q$_1$ sequentially;

a junction of the first decoupling capacitor C$_2$ and the first AC blocking resistor RG$_1$ is connected to a gate supply voltage V$_{gs1}$;

a first end of the second decoupling capacitor C$_3$ is grounded, and a second end of the second decoupling capacitor C$_3$ is connected to the output inductor L$_3$, the output microstrip line MLIN$_3$, and a drain electrode of the first transistor Q$_1$; a junction of the second decoupling capacitor C$_3$ and the output inductor L$_3$ is connected to a drain supply voltage V$_{ds1}$; and a junction of the output inductor L$_3$ and the output microstrip line MLIN$_3$ acts as an output terminal of the preamplifier circuit;

a second DC blocking capacitor C$_4$ is disposed between the preamplifier circuit and the post amplifier circuit;

a first end of the first gate microstrip line MLIN$_4$ acts as an input terminal of the post amplifier circuit, and a second end of the first gate microstrip line MLIN$_4$ is connected to the second gate microstrip line MLIN$_5$, the third gate microstrip line MLIN$_6$, the fourth gate microstrip line MLIN$_7$, the second AC blocking resistor RG$_2$, and the third decoupling capacitor C$_5$ sequentially; and one end of the third decoupling capacitor C$_5$ is grounded;

a junction of the second AC blocking resistor RG$_2$ and the third decoupling capacitor C$_5$ is connected to a gate supply voltage V$_{gs2}$; a junction of first gate microstrip line MLIN$_4$ and the second gate microstrip line MLIN$_5$ is connected to a gate electrode of the second transistor $Q_2$; a junction of the second gate microstrip line $MLIN_5$ and the third gate microstrip line $MLIN_6$ is connected to a gate electrode of the third transistor $Q_3$; a junction of the third gate microstrip line $MLIN_6$ and the fourth gate microstrip line $MLIN_7$ is connected to a gate electrode of the fourth transistor $Q_4$;

the drain inductor $L_4$ is disposed between drain electrodes of the second transistor $Q_2$ and the third transistor $Q_3$;

the first drain microstrip line $MLIN_8$ is disposed between drain electrodes of the third transistor $Q_3$ and the fourth transistor $Q_4$; and a junction of the first drain microstrip line $MLIN_8$ and the fourth transistor $Q_4$ is connected to a first end of the second drain microstrip line $MLIN_9$; a second end of the second drain microstrip line $MLIN_9$ is connected to first ends of the fourth decoupling capacitor $C_6$, the AC blocking inductor $L_5$, and the third DC blocking capacitor $C_7$; a second end of the fourth decoupling capacitor $C_6$ is grounded; a second end of the AC blocking inductor $L_5$ is connected to a voltage source $V_{ds2}$; and a second end of the third DC blocking capacitor $C_7$ acts as an output terminal of the post amplifier circuit.

\* \* \* \* \*